United States Patent
Porcelli

(10) Patent No.: US 9,882,348 B2
(45) Date of Patent: Jan. 30, 2018

(54) INDUCTION OF FORCE PERFORMED BY THE SEMICONDUCTOR LASER DIODES

(71) Applicant: Elio Battista Porcelli, Sao Paulo (BR)

(72) Inventor: Elio Battista Porcelli, Sao Paulo (BR)

( * ) Notice: Subject to any disclaimer, the term of this patent is extended or adjusted under 35 U.S.C. 154(b) by 1263 days.

(21) Appl. No.: 13/919,315

(22) Filed: Jun. 17, 2013

(65) Prior Publication Data
US 2014/0368049 A1    Dec. 18, 2014

(51) Int. Cl.
*H01S 5/06* (2006.01)
*H01S 5/022* (2006.01)

(52) U.S. Cl.
CPC ............ *H01S 5/06* (2013.01); *H01S 5/02212* (2013.01)

(58) Field of Classification Search
None
See application file for complete search history.

(56) References Cited

U.S. PATENT DOCUMENTS 4,329,658 A * 5/1982 Doi ..................... H01L 33/0025
257/E33.049

* cited by examiner

*Primary Examiner* — Armando Rodriguez
(74) *Attorney, Agent, or Firm* — Welsh Flaxman & Gitler LLC

(57) ABSTRACT

Until now, the laser beam light is the main feature to be provided by semiconductor laser diodes. The highly ordered direct current of charge carriers injected into the active region of these electronic components above the lasing threshold can be used in innovative ways. This attribute is associated with a new theoretical concept when all particles which are part of macroscopic objects are widely coupled to each other via quantum entanglements—it can generate a distance force induction and a self-induction of force. Considering this, a force can be inducted in the external objects—thrusting them—and a force can be inducted in the own semiconductor laser diode structure for its self propulsion.

1 Claim, 4 Drawing Sheets

INDUCTION OF FORCE PERFORMED BY THE SEMICONDUCTOR LASER DIODES

BACKGROUND OF THE INVENTION

1. Field of the Invention

The present invention relates to a semiconductor laser diode used for induction force in external objects and for self-induction force in its own structure. Specifically, the induction generation is performed with its internal electrical direct current widely coupled with the environment. This coupling is not intermediated by the light laser beam and it results from the quantum entanglements. The direction of the induction of force is the same as the charge carriers moving inside the active region.

2. Description of the Related Art

Present day semiconductor laser diodes are often used for highly coherent and focused light beam generators with many different applications.

Important new applications of those electronic devices, without using its most used functionality as laser beam, can be performed.

These new applications may even surpass this common use involving laser light.

The special use of those electronic components for these new applications is its highly ordered direct electrical current concentrated in the active region above the lasing threshold operation.

The concentration of charge carriers in the direct electrical current is associated with the gain during the stimulated emission of photons and it is possible because of the coupling between the synchronized transition of the quantum state of the charge carriers and the highly organized photons confined in the light resonant cavity.

The main agents for these new applications are the coupled charge carriers (electrons) with the external particles in the environment (some of them are part of the macroscopic objects).

The coupling between the highly organized charge carriers (occupying a number of different quantum states quite reduced) and all other external particles is performed according to the concept of Generalized Quantum Entanglement.

An amount of momentum transfers from the charge carriers and the external particles in the case of a semiconductor laser diode.

In case of a trivial conductor (a metallic wire), the charge carriers inside follow the flow along the same direction but they are not well concentrated and organized (occupying a number of different quantum states quite large). As such, that the intensity of the induction of force is extremely weak in comparison with semiconductor laser diodes even considering the same wide coupling via quantum entanglements.

This particular attribute of a semiconductor diode laser allows a considerable induction of force in other external objects or allows induction of force in its own structure.

External objects can be inducted by the semiconductor diode lasers independent of their material constitution. On the other hand, the induction can affect all kind of objects or particles and this is not realized by a laser beam, for example (electromagnetic interactions can only affect electrical charged particles). This induction is related to the wide coupling between the particles predicted by the Generalized Quantum Entanglement concept.

The intensity of induction depends directly on the intensity of the current flowing inside the semiconductor laser diode, specifically in the active region. Because of this, even components with low power (non professional applications) can generate some detectable force.

Other dependence is related to the gain of the active region and this parameter depends on the resonant cavity geometry and the charge carriers' density injected in the semiconductor (region doping).

The divergence of the induction of force is determined by this parameter (the resonant cavity geometry and the charge density in the semiconductor regions) and considering this, the induction may affect external objects placed various distances from the position of the semiconductor laser diode. In other words, the space geometry of the induction can be focused or not, but this can be adjusted accordingly.

The main mentioned parameters, such as intensity of internal current, geometry of resonant cavity and density of charge carriers in the semiconductor material, can determine the induction of force on its own structure too. This auto induction can cause motion.

SUMMARY OF THE INVENTION

It is well known that the electrically Pumped Semiconductor laser Diodes find wide use through their high coherent light emission. Surprisingly, these devices can be used like force inductors and such induction is not caused by the laser beam, but is caused by the highly ordered flow of the charge carriers through the internal resonant cavity and its mutual coupling with the external environment.

The highly ordered state of the charge carriers is caused by the stimulated emission of photons above the lasing threshold state. An innovative feature is that there is a coupling between these highly ordered charge carriers and the external environment via widely existing quantum entanglements. Properly adjusting some parameters such as the intensity of the direct current in the diode, current direction, resonant cavity geometry and gain (density of charge carriers in semiconductor regions N and P), it is possible to control the force inducted in the external targets or the thrust self-induced in the laser diode structure.

BRIEF DESCRIPTION OF THE DRAWINGS

The invention will now be explained in more detail with reference to several embodiments and the drawing, in which.

The Figures are purely diagrammatic and not drawn to scale. Corresponding parts are generally given the same reference numerals in the Figures.

DETAILED DESCRIPTION OF THE INVENTION

The detailed embodiments of the present invention are disclosed herein. It should be understood, however, that the disclosed embodiments are merely exemplary of the invention, which may be embodied in various forms. Therefore, the details disclosed herein are not to be interpreted as limiting, but merely as a basis for teaching one skilled in the art how to make and/or use the invention.

Figure 1:
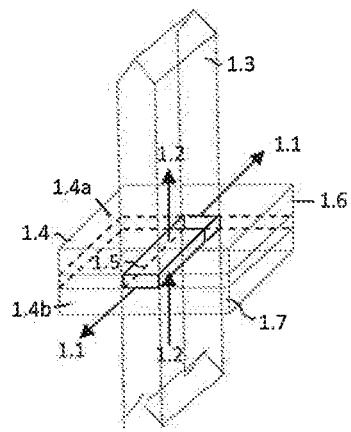
FIG. 1 diagrammatically shows a geometrical projection of the force induction that emerges from the resonant cavity and its parallel direction of the direct current flow upwards direction.

FIG. 1 diagrammatically shows a geometrical projection of the force induction emerging from a resonant cavity 1.5 in the parallel direction of the direct current flow (upwards direction). As shown, Reference 1.5 indicates the resonant cavity consisting of an optically transparent crystal. Reference 1.6 indicates the back facet of the resonant cavity 1.5 and the reference 1.7 indicates the front facet of the resonant cavity 1.5. The reference 1.1 indicates the laser beam direction emerging from the front facet 1.7 and back facet 1.6 of semi-reflective resonant cavity 1.5. Reference 1.2 indicates the current flow in the upwards direction through the resonant cavity 1.5. Reference 1.3 indicates the projection of the induction of force designated in dotted line from the upper area and from lower area regarding the resonant cavity 1.5. The induction of force is pointing upwards as indicated in the vertex designed for educational purposes. Reference 1.4 indicates the structure of the semiconductor laser diode where the resonant cavity 1.5 is sandwiched by two different semiconductor regions 1.4a, 1.4b.

Figure 2:
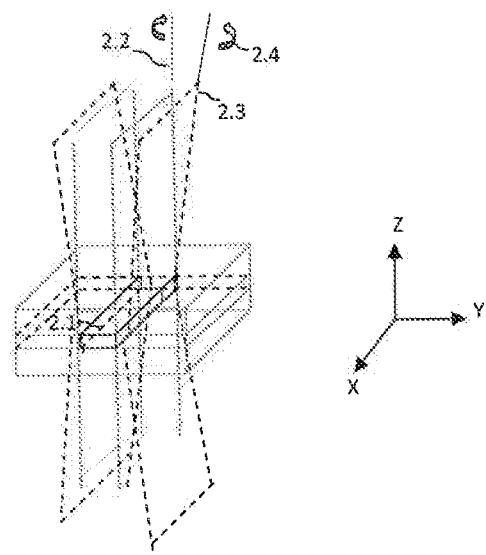
FIG. 2 diagrammatically shows the divergence in the projection of the induction of force according to the geometrical divergence factor d in the Y axis.

FIG. 2 diagrammatically shows how the divergence in the projection of the induction of force according to the geometrical divergence factor d in the Y axis. Reference 2.1 indicates the resonant cavity where the force induction is projected from its upper area and lower area. Reference 2.2 indicates the projection of force induction with null divergence designated with dotted line. Reference 2.3 indicates the projection of force induction with some divergence designated with dashed line. Reference 2.4 indicates the angle between the projection of induction of force with divergence and without divergence. The geometrical divergence factor d is the cosine of this mentioned angle. The intensity of the force induction in the upper region of the resonant cavity 2.1 will be inversely proportional to the cosine of this mentioned angle. Therefore, this intensity decays along the Z axis (distance from the resonant cavity upper facet).

Figure 3:
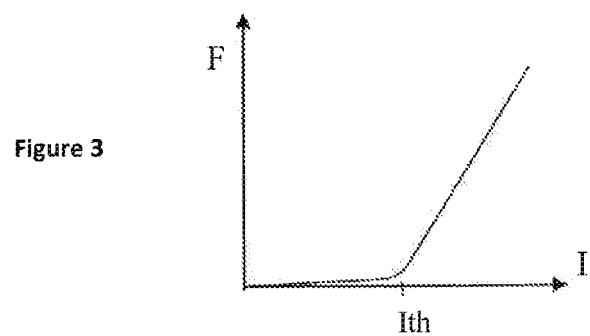
FIG. 3 diagrammatically shows the curve of behavior of the induction of force F according to the intensity of the direct current flow (I). Above the threshold lasing current (Ith), the induction of force intensity linearly increases according to the direct current increasing.

FIG. 3 diagrammatically shows the curve of behavior of the induction of force F according to the intensity of the direct current flow (I). Above the threshold lasing current (Ith), the induction of force intensity linearly increases according to the direct current increasing. This behavior is the same as the optical power because of the optical coupling with the charge carriers (the real origin of the induction of force).

Figure 4:
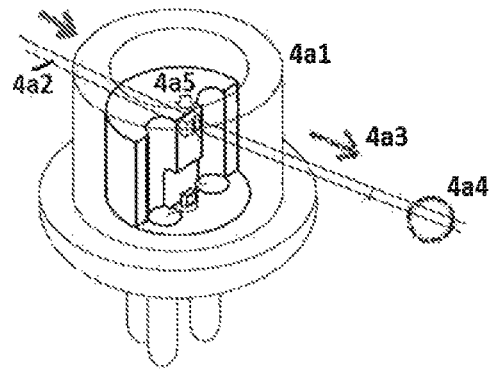
FIG. 4, comprised of FIGS. 4a and 4b, diagrammatically shows the projection of the induction of force. Such projection of the induction of force is shown in external objects in FIG. 4a and the possible thrusting in the laser diode structure caused by the self induction of force in FIG. 4b. The encapsulation of the semiconductor laser diode shown in FIG. 4a and FIG. 4b is a TO-56 type.
Figure 4:
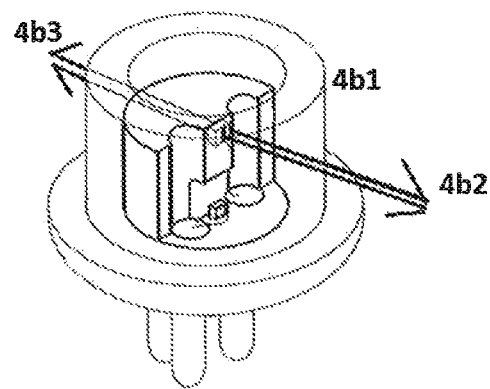

FIG. 4 diagrammatically shows the projection of the induction of force in external objects in FIG. 4a and the possible thrusting in the laser diode structure caused by the self induction of force in FIG. 4b. Both cases consider the usual encapsulation of a popular semiconductor laser diode in the market. Reference 4a1 indicates the encapsulation of the popular laser diode. Reference 4a2 indicates the projection of the force induction with the length of die resonant cavity (considering a null divergence) emerging from its back and front facet. Reference 4a3 indicates the force induction direction. Reference 4a4 indicates a neutral body "illuminated" by die induction of force projection. Reference 4a5 indicates a semiconductor diode laser structure in the diode encapsulation in which is placed the resonant cavity and its induction of force projection emerging. Reference 4b1 indicates a semiconductor laser diode encapsulation thrust (see reference 4b3) in the opposite direction than the projection of the force direction that is the same direction than the direct current—injection of electrons in the active region (see reference 4b2). This is a propulsion system using the interaction of those electrons and the environment via Generalized Quantum Entanglements and the action-reaction principle.

An Electrically Pumped Semiconductor Laser Diode has its active medium formed by a p-n junction of a semiconductor diode similar to that found in a light-emitting diode (LED). This is formed by doping a thin layer on the surface of a crystal wafer to produce an n-type region and a p-type region, one above the other, resulting in a p-n junction between both regions. The mentioned regions have two kinds of charge carriers named holes and electrons, respectively injected in the crystal for p-type and n-type. A depletion region, devoid of any charge carriers, forms as a result of the difference in the electrical potential between n- and p-type semiconductors wherever they are in physical contact. A spontaneous emission of a photon happens when an electron and a hole are present in the same region where they recombine or "annihilate" and its energy is equal to the difference between the electron and hole energy states involved. Spontaneous emission gives the laser diode, described below, lasing threshold properties similar to a LED and this process is necessary to initiate laser oscillation.

Electrons and holes may coexist in proximity to one another, without recombining, for a certain time, in the absence of stimulated emission. Then a nearby photon with energy equal to the recombination energy can cause recombination by stimulated emission and this generates another photon of the same polarization, travelling in the same direction, with the same frequency and phase as the first photon. So this means that stimulated emission causes gain in an optical wave (of the correct wavelength) in the injection region, and the gain increases as the number of electrons and holes injected across the junction increases.

Besides the increase of electrons and holes injected into the junction (increase of direct current density in the active region), they obey a synchronized transition state energy. This means that the direct current in the laser diode, especially across the active region, is much more ordered than within a trivial conductor.

According to the theoretical model named "Generalized Quantum Entanglement", all particles are widely coupled. Considering this, the electrons of the highly ordered direct current are self-coupled and coupled with all external particles. These electrons have a holistic behavior considering that they obey the same quantum wave and because of this they have a collective momentum.

In this condition, the intensity of the collective momentum exchanged between the direct current and all external particles from environment can be increased and the amount of increase depends on the intensity of the current.

For instance, there is a momentum exchange between a current flow in a trivial conductor and the environment around it, but its intensity is weak in comparison to a direct current in the active region in a semiconductor laser diode.

Another parameter that determines the intensity of the momentum exchanged is the gain factor of the semiconductor laser diode. This parameter depends specifically on the resonant cavity geometry (dimensions) and the density of charge carriers injected for semiconductor regions N and P. The space divergence of the induction depends on the geometry of the resonant cavity. Its direction of the resonant cavity is perpendicular to the laser beam projected from the resonant cavity and its direction is also parallel to the direction of the charge carriers movement (electrical current) as depicted in FIG. 1.

According to this mentioned divergence, the intensity of the induction can be reduced or not depending on the distance from the resonant cavity.

There is always a divergence in the laser beam and this must be adjusted accordingly by some optical resources like a lens considering the light propagation but, in case of the induction, its divergence is at a minimum for comparison and it depends on the dimensionality and geometric symmetry of the resonant cavity.

The direction of the force inducted in external objects depends on the direction of the direct current flowing in the active region such as indicated in the FIG. 1. In the same way, the direction of the semiconductor laser diode structure thrust depends on the antiparallel direction of the direct current flowing.

In terms of semiconductor laser diodes specifications, single mode (waveguide thin of resonant cavity in the vertical direction) and multimode (waveguide wide of resonant cavity in the vertical direction) types generate, respectively, a narrow light beam with a single wavelength and a wide light beam with multi wavelengths.

It means that the electrons from the direct current flowing by the active region in the single mode diode have the same energy state level and some spread energy level in case of a multimode diode. Because of this, the single mode diode is more useful for induction of force considering that the same energy state level means more collective organization.

In die case of single mode diodes, the induction of force can be proportional with some parameters such as µo, G, I and d considering the current values above the lasing threshold and usual temperature specification for the semiconductor laser diode.

Where µo is the magnetic constant ($4*\pi*10^7$ H/m), I is the direct current, G is the resonant cavity gain and d is the divergence factor of the induction.

For this calculation it is considered that the area of the induction of force is smaller than the area of the target object or at least this has the same size.

If the area of the target object is smaller than the area of the induction of force than the intensity of the force will obey the rate $F''=Ai/At*F$.

Where F is the force projected from the diode, F" is the real force inducted in the target object, Ai is the induction of force geometric area, At is the area of the target object (partially illuminated).

The divergence factor of the induction is the cosine of the divergence angle with the direction of the force induction such as indicated by FIG. 2.

In case of the force self-induced that generates a thrust in the semiconductor laser structure, the divergence factor value considered for the calculus is equal to 1.

The curve of the force follows directly the curve of the laser beam emission intensity. Above the lasing current threshold such as indicated in the FIG. 3, the induction of force increases abruptly.

The induction can affect all kinds of different materials considering the wide coupling according to the Generalized Quantum Entanglement concept and this attribute is different than a light laser beam, that it is an electromagnetic interaction affecting only charged particles.

Regarding the type of semiconductor laser diodes useful for the present invention, components with a simple structure are extremely inefficient.

Double Heterostructure Lasers are much more efficient and more popular in the market.

The advantage of a Double Heterostructure Laser is that the region where free electrons and holes exist simultaneously, which is known as the active region, is confined to the thin middle layer. This means that many more of the electron-hole pairs can contribute to amplification—not so many are left out in the poorly amplifying periphery. In addition, light is reflected from the heterojunction; hence, the light is confined to the region where the amplification takes place. The larger amount of electrons concentrated means the greater amount of momentum transferred to the outside. This is because these devices usually use an active region with a layer of a different thin material sandwiched by n-type and p-type semiconductor layer. If the middle layer is made thin enough, it acts as a quantum well. This means that the vertical variation of the electron's wave function, and thus a component of its energy, is quantized. Considering this, the efficiency of a quantum well laser is greater than that of a bulk laser because the density of states function of electrons in the quantum well system has an abrupt edge that concentrates electrons in the same energy states that contribute to laser action and consequently with amplification of the moment transferred to the outside via quantum coupling as mentioned before.

Multiple quantum well lasers are known as containing more than one quantum well layer and this feature can improve the overlap of the gain region with the optical waveguide mode.

To compensate for the problem with a simple quantum well diode described above, that is the thin layer is too small to effectively confine the light, another two layers are usually added on, outside the first three. These layers have a lower refractive index than the centre layers, and hence confine the light effectively. Such a design is called a separate confinement heterostructure (SCH) laser diode and almost all commercial semiconductor laser diodes since the 1990s have been using this concept and therefore these popular components with less than 1 Watt optical power in the market can be used for the weak induction of force.

Considering the usual TO-56 type encapsulation in the popular semiconductor laser diode in the market, FIG. 4a shows the direction of induction of force affecting an external object and FIG. 4b depicts the direction of the thrust of the laser diode structure considering the self induction of force. FIGS. 4a and 4b are part of FIG. 4.

Figure 5:
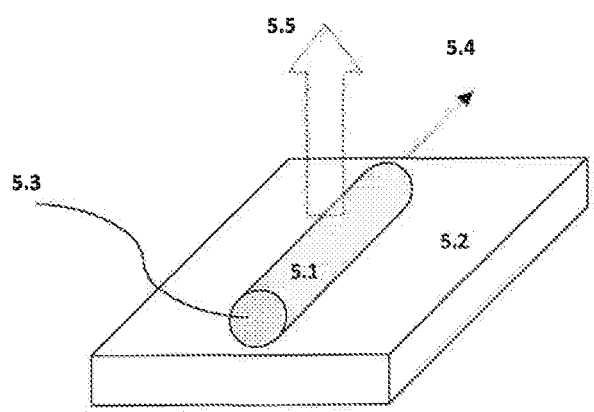
FIG. 5 diagrammatically shows a usual laser pointer supplied via wires from an external voltage source (not shown) mechanically supported by a plastic platform.

An example of a specific use of the invention relates to the self induction of force and is shown as follows:

FIG. 5 illustrates a device implemented for self induction of force pointing upwards 5.5. The device is composed by a laser pointer 5.1 which is connected by wires 5.3 to a 3 V external DC voltage source not drawn in the figure. The laser pointer 5.1 is supported on a horizontal platform 5.2 made of plastic. The self induction of force in the vertical direction is generated when the laser pointer is emitting a 532 nm wavelength light laser beam in the horizontal direction 5.4. Up to 200 mW is achieved in terms of output optical power. In this condition, the charge carriers move down in the active region.

The laser pointer has an internal semiconductor laser diode with an encapsulation of the TO-56 type and its position must be adjusted in order to ensure that the direct current above the lasing threshold is pointing downwards accordingly.

The intensity of the self induction of force F generated by this kind of semiconductor laser diode can be calculated using the formula $F=\mu_o*G*I^2$ considering its parameters such as a 200 mA direct current I, a 400 resonant cavity gain G and a usual magnetic constant $\mu_o$ equal to $4*\pi*10^{-7}$ H/m.

Considering this, an upward self induction of force F equal to $2*10^{-5}$ N is generated against the weight force of the device on the sea level resulting in 2 milligram weight reduction. It means that the load can be slightly reduced in this device. This self induction of force F can be measured even considering its weak intensity.

The weight for this device is 73 grams where only a semiconductor laser diode with TO-56 encapsulation is used. Keeping with this same weight and size, it is possible to multiply the self induction of force F per ten adding more for TO-56 type semiconductor laser diodes connected and mechanically aligned in the same electronic circuit. It is possible to drive a direct current almost twice higher for each laser diode to achieve this mentioned gain as well.

When the intensity of the self induction of force generated by a semiconductor laser diodes surpass its own structural weight force on the ocean level, this device can be used to reduce significantly the load of the vehicles or carriers where it is linked mechanically.

In case of the device considered in the FIG. 5, the direct current I must be equal to 38 A in order for the self induction of force to surpass its own weight force on the earth surface, but this value is far beyond the maximum operating limit.

Considering the space navigation, where the earth gravitational acceleration is reduced significatively, the device showed in the FIG. 5 can be used as an impeller.

Some electrically pumped semiconductor laser diodes in the scientific, industrial and professional market with other kinds of encapsulations can use a direct current higher than 1 A. But carbon dioxide lasers are most often used in cases where highest-power applications are needed instead of semiconductor laser diodes because of some difficulties to control the state of semiconductors in high temperature, for example.

This new use related to self induction of force encourages the development of electrically pumped semiconductor laser diodes with higher-power level than used in carbon dioxide lasers.

A second specific use of the invention is related to the induction of force in external objects and is shown as follows:

Regarding the same laser pointer 5.1 used in the device shown in the FIG. 5, the calculation to find the self induction of force F intensity is the same is the induction of force in external objects. This force is equal to $2*10^{-5}$ N considering the same laser pointer with the same parameters mentioned before such as a 200 mA direct current I, a 400 resonant cavity gain G and a usual magnetic constant to equal to $4*\pi*10^{-7}$ H/m.

The intensity of this force is strong enough to be detected by an accelerometer with 0.00006 g resolution and 48 grain weight located in some distance. It is considered a negligible divergence of the projection of induction emerging from the resonant cavity of the semiconductor laser diode with 400 μm length. This geometric projection of induction of force is intercepted by the accelerometer and it passes through any means considering the nature of the generalized quantum entanglements. This property can be really useful.

Figure 6:
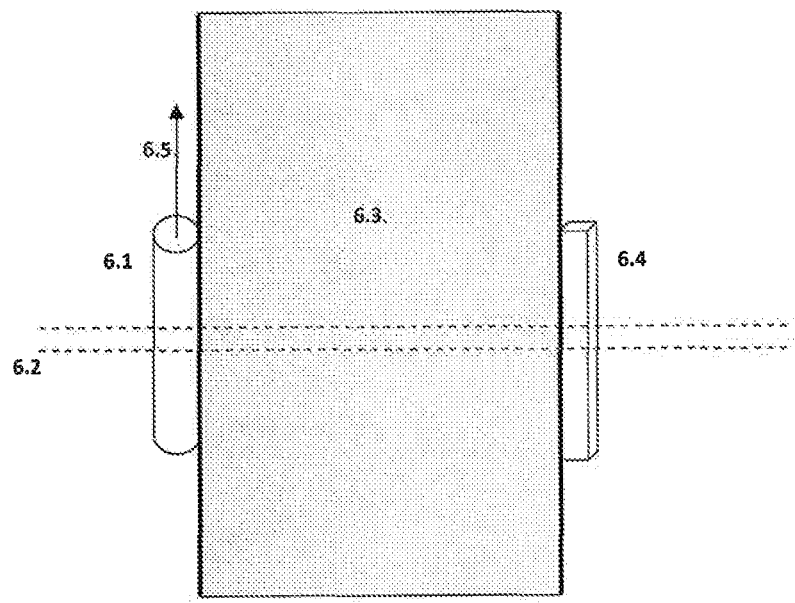
FIG. 6 diagrammatically shows a usual laser pointer projecting an external induction of force when emitting an orthogonal light laser beam.

FIG. 6 shows a laser pointer 6.1 projecting an induction of force 6.2 through a massive, thick and opaque wall 6.3. This laser pointer 6.1 is the same as that shown in the FIG. 5.1, but using two internal batteries providing a 3 V DC voltage. The accelerometer 6.4 is placed in the other side of the wall 6.3 and it is intercepted by the induction of force projection. The induction of force is detected by the accelerometer 6.4 and a negative or positive acceleration is registered according to the direction pointed by the force 6.2. This direction pointed by the force 6.2 depends on the direction of the direct current in the resonant cavity of the semiconductor laser diode used in the laser pointer 6.1. The position of the laser pointer 6.1 must be adjusted to ensure that the induction of force projection achieve the accelerometer 6.4 accordingly. Two points separated by the wall 6.3 can be marked with precision. The arrow 6.5 shows a light laser beam orthogonal than the induction of force projection.

The setup shown in the FIG. 6 can be used for metrology considering the actual difficulties to mark two or more points that need to be geometrically linked by a straight line in the huge and massive structures where it can not be crossed by a light laser beam.

Currently the methodology for this procedure is expensive, inaccurate and time consuming, considering that many external sensors are used around the structure where the measurements are made indirectly.

The summary of the these specific uses of this invention is that the first utilizes the usual semiconductor laser diodes as impellers in the outer space via self induction of force and which can be upgraded for use on the earth's surface and second utilizes the semiconductor laser diodes as metrology tools using the property related to the induction of force in external objects.

What is claimed is:
1. A method for using a semiconductor laser diode to produce an induction force in other external objects or particles, as well as producing a self-induction force, comprising the steps of:
   positioning a projection area of a resonant cavity of the semiconductor laser diode according to its direct current flow direction and external objects and particles;
   generating the induction force and the self-induction force above a lasing light current threshold state by the semiconductor laser diode; and
   initiating the induction force to the external objects and particles by the ordered charge carriers of highly concentrated current of the semiconductor laser diode taking into account a preexisting state of generalized quantum entanglements between all parts of the semiconductor laser diode and the external objects and particles.

* * * * *